United States Patent [19]

Senoue et al.

[11] Patent Number: 4,581,101

[45] Date of Patent: Apr. 8, 1986

[54] DRY-ETCHING PROCESS

[75] Inventors: Makoto Senoue, Funabashi; Kunihiko Terase, Tokyo; Shinya Iida; Hideo Komatsu, both of Hamura, all of Japan

[73] Assignees: Asahi Glass Company Ltd.; Kokusai Electric Co., Ltd., both of Tokyo, Japan

[21] Appl. No.: 657,524

[22] Filed: Oct. 4, 1984

[30] Foreign Application Priority Data

Oct. 4, 1983 [JP] Japan .................. 58-184399

[51] Int. Cl.$^4$ ............... H01L 21/306; B44C 1/22; C03C 15/00; C23F 1/00
[52] U.S. Cl. ........................ 156/643; 134/1; 156/646; 156/656; 156/657; 156/659.1; 156/662; 156/664; 156/665; 204/192 E; 252/79.1; 427/38

[58] Field of Search ............ 134/1; 156/643, 646, 156/653, 656, 657, 659.1, 662, 664, 665; 252/79.1; 204/164, 192 E, 192 EC; 427/38, 39; 430/313, 317, 318

[56] References Cited

U.S. PATENT DOCUMENTS 4,260,649 4/1981 Dension .................. 156/635 X
4,308,089 12/1981 Iida et al. .................. 156/665 X
4,372,807 2/1983 Vossen et al. .................. 156/665 X

*Primary Examiner*—William A. Powell
*Attorney, Agent, or Firm*—Oblon, Fisher, Spivak, McClelland & Maier

[57] ABSTRACT

A dry-etching process comprising dry-etching treatment of semiconductor material by action of a gas and, if necessary, cleaning treatment, characterized in that at least one of the dry-etching and cleaning treatments is conducted under action of a gas composed essentially of a fluorinated ether.

9 Claims, No Drawings

DRY-ETCHING PROCESS

The present invention relates to a dry-etching process for forming fine patterns for semiconductor integrated circuits (IC).

With the progress in the dry-etching technique, it has become possible to form finer patterns of elements for IC, whereby higher performance and higher integration of IC have been brought about. As the dry-etching process, there have been known a barrel-type plasma etching process wherein a chemical reaction is utilized, and an ion etching process or an ion beam etching process wherein an innert gas such as argon or a reactive gas such as tetrafluoromethane, is employed. In these processes, it is common to employ, as the etching gas, a chlorine compound such as carbon tetrachloride or boron trichloride; a fluorine compound such as tetrafluoromethane; or a gas mixture of such a compound with e.g. oxygen.

The selection of the etching gas is extremely important, since it affects almost all aspects of the etching performance. Accordingly, researches for an optimum etching gas are being made with a view to increasing the etching speed ratio of e.g. a silicon oxide layer or a PSG (phospho silicate glass) layer to be etched to a silicon underlayer or a resist layer used as a protecting mask, or with a view to preventing the formation of an etching residue or a polymer. For the former purpose, it has been proposed to use a gas mixture of tetrafluoromethane with hydrogen, and for the latter purpose, it has been proposed to incorporate oxygen or carbon dioxide into the etching gas. However, an etching gas which is capable of removing the etching residue or polymer or of efficiently preventing the formation thereof, has a tendency to have a low etching speed ratio or low etching selectivity. Under the circumstances, it has been desired to develop a gas which is effective for both purposes.

The present invention provides a dry-etching process comprising dry-etching treatment of a semiconductor material by action of a gas and, if necessary, cleaning treatment, characterized in that at least one of the dry-etching and cleaning treatments is conducted under action of a gas composed essentially of a fluorinated ether.

Now, the present invention will be described in detail with reference to the preferred embodiments.

The present inventors have conducted extensive researches for an etching gas having high etching selectivity and being free from the formation of a polymer, and have found that a fluorinated ether is extremely effective for this purpose.

According to the dry-etching treatment of a semiconductor material by the etching gas of the present invention, it is possible to attain high etching selectivity, to prevent the formation of an etching residue or polymer or remove such a formed residue or polymer, and to inhibit the corrosion of the semiconductor material. Further, in the dry-etching treatment of a semiconductor material by an etching gas other than the etching gas of the present invention, it is possible to use the etching gas of the present invention for so-called cleaning treatment i.e. treatment to remove the etching residue or polymer or to inhibit the corrosion of the semiconductor material.

Thus, the present invention provides a dry-etching process comprising dry-etching treatment of a semiconductor material by action of a gas and, if necessary, cleanig treatment, characterized in that at least one of the dry-etching and cleaning treatments is conducted under action of a gas composed essentially of a fluorinated ether.

As semiconductor materials to be etched, there have been known, for instance, $Si_3N_4$, poly-Si, Al, $SiO_2$, PSG (phospho silicate glass), Mo, W, Ti, Ta, an Al alloy (such as Al-Si, Al-Cu or Al-Si-Cu), MoSi, WSi, TiSi, TaSi. The etching gas of the present invention may be applied to these materials.

The etching gas of the present invention has good etching selectivity such that in the etching of $SiO_2$ or PSG, the etching speed ratio to the Si underlayer or to the resist layer of the protecting mask can be made high, or in the etching of a poly-Si layer formed on a $SiO_2$ layer, the etching speed ratio to $SiO_2$ or to the resist layer can be made high.

On the other hand, it has been further found that by employing the fluorinated ether of the present invention for the dry-etching treatment and the cleaning treatment, it is possible not only to obtain good etching selectivity, but also to effectively prevent the formation of the polymer or etching residue, or the corrosion of aluminum materials, which used to be a problem. In the etching of Si by a fluorohydrocarbon gas such as tetrafluoromethane, it is likely that a fluorocarbon polymer deposits on the Si surface. In the etching of Al by a chlorohydrocarbon gas such as carbon tetrachloride, it is likely that a polymer residue remains on the $SiO_2$ material i.e. the substrate. Likewise, in the case of an aluminum alloy such as Al-Si or Al-Si-Cu, it is likely that an etching residue attributable to Si or Cu forms. Furthermore, it frequently happens that after the completion of etching treatment of e.g. an aluminum-type semiconductor material, a corrosion product of aluminum forms, which impairs the electric connection of elements. These problems can be solved by employing the fluorinated ether of the present invention for the dry-etching treatment and the cleaning treatment.

Even when an etching residue or polymer forms as a result of the employment of a conventional gas for the dry-etching treatment, it is possible to remove the formed product by using the fluorinated ether of the present invention for the subsequent cleaning treatment.

Thus, according to the process of the present invention, it is possible to prevent the formation of the polymer or etching residue, or the corrosion product of aluminum, or to remove such formed products. Besides, the process of the present invention is also effective for the removal of various contaminating substances, particularly chlorides formed in the etching chamber.

As the fluorinated ether which may be employed for the process of the present invention, there may be mentioned a cyclic ether such as

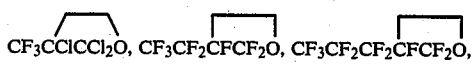

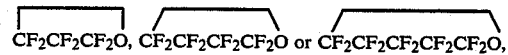

or an aliphatic saturated or unsaturated ether such as CF$_3$OCF=CF$_2$, CF$_2$IOCF$_2$I, CF$_3$OCF$_3$, CF$_3$OHF$_2$, CF$_3$OCF$_2$CF$_2$Cl, CF$_2$IOCF$_2$CF$_2$I, CF$_3$OCFClCF$_2$Cl, CF$_2$ClOCCL$_2$CF$_3$, CF$_3$CF$_2$OCHFBr, CHCl$_2$OCF$_2$CFClBr, CHF$_2$OCF$_2$CF$_2$Br, CH$_3$OCF$_2$CHCl$_2$ or CF$_3$OCF$_2$CF$_3$. The cyclic ether is preferred. Particularly preferred is a perfluoroepoxide such as

(hexafluoropropylene oxide hereinafter referred to simply as "6FPO"). These compounds may be used alone or in combination as a mixture of at least two different kinds. In the case of a mixture, it is preferred to use a perfluoroepoxide as the main component.

Various conventional etching gases may be incorporated to the above mentioned fluorinated ether compound to attain various features. For instance, in the dry-etching of SiO$_2$ or PSG, it is possible to increase the effectiveness in the inhibition of the formation of the polymer while maintaining the selectivity as between Si of the substrate material and the photo-resist, by incorporating trifluoromethane. Further, in the etching of poly-Si or a metal layer such as Mo, Ti, W or Ta, a high etching speed and hignly selective etching will be possible by incorporating chlorine gas. In the case where 6FPO is used, the volume ratio of 6FPO/CHF$_3$ is usually from 0.01 to 5.0, preferably from 0.05 to 1.0, and the volume ratio of 6FPO/Cl$_2$ is usually from 0.5 to 40, preferably from 1.0 to 20. Of course, even when 6FPO is used alone, superior results are obtainable compared with the conventional processes such that the etching speed is higher, the etching selectivity is higher, and there is no formation of a polymer. As other etching gases which may be incorporated, there may be mentioned, for instance, saturated halogenated hydrocarbons represented by the following general formula I, and unsaturated halogenated hydrocarbons represented by the following general formula II:

$$C_nH_{2n+2-m}X_m \quad (I)$$

where $1 \leq n \leq 10$, $1 \leq m \leq 22$, and X is F, Cl, Br or I.

$$C_pH_{2p+2-4q-2l-k}X_k \quad (II)$$

where $1 \leq p \leq 4$, q is a number of triple bonds, l is a number of double bonds, $1 \leq k \leq 8$, and X is F, Cl, Br or I.

The compounds represented by the above general formula I include trifluoromethane, tetrafluoromethane, trichloromethane, tetrachloromethane, tribromomethane, tetrabromomethane, triiodomethane, bromotrifluoromethane, dibromodifluoromethane, iodotrifluoromethane, diiododifluoromethane, chlorotrifluoromethane, dichlorodifluoromethane, bromochloromethane, trichlorobromomethane, ethyl chloride, dichloroethane, trichloroethane, tetrachloroethane, ethyl bromide, dibromoethane, tetrabromoethane, ethyl iodide, chloropentafluoroethane, hexafluoroethane and octafluoropropane.

The compounds represented by the above general formula II include difluoroacetylene, trichloroethylene, vinyl bromide, tetrafluoroethylene and chlorotrifluoroethylene.

As other compounds, there may be mentioned various known or well known etching gases such as octafluorocyclobutane, sulfur hexafluoride, nitrogen trifluoride, chlorine trifluoride, phosphorus trichloride, boron trichloride, boron tribromide, silicon tetrachloride, silicon tetrafluoride, carbon dioxide, carbon monooxide, oxygen, chlorine, helium, bromine, fluorine, iodine, hydrogen or nitrogen.

Now, the present invention will be described in further detail with reference to Examples. However, it should be understood that the invention is by no means restricted by these specific Examples.

EXAMPLE 1

A positive photo-resist OFPR 800 manufactured by Tokyo Oka K.K. was applied onto a specimen of a Si wafer on which 0.8 μm of a PSG layer containing 8% of phosphorus was deposited, and then subjected to exposure and development to form windows for the formation of patterns.

The sample thereby obtained was placed on a cathode, and subjected to etching in an etching system wherein the pressure was maintained at a level of 8 pa by introducing C$_3$F$_6$O at a rate of 100 ml/min and CHF$_3$ at a rate of 50 ml/min, by applying high frequency (13.56 MHz) at an output of 0.8 KW (0.3 W/cm$^2$). The terminal point was detected by monitoring by means of a spectroscopic analysis whereby etching was found to be completed in 13 minutes. The etching speed ratios of PSG/Si and PSG/photo resist at that time, were 10.2 and 12.8, respectively. No formation of any polymer was observed on the electrode or in the etching system under this etching condition.

On the other hand, in the etching under the same condition by using CHF$_3$ alone, a substantial amount of a polymer was formed, and in the etching by using a gas mixture of CF$_4$/O$_2$ (10/1), the etching speed ratios of PSG/Si and PSG/photo resist were 3.0 and 2.0, respectively, although no formation of any polymer was observed.

EXAMPLE 2

A sample prepared in the same manner as in Example 1, was placed on a cathode, and subjected to etching in an etching system wherein the pressure was maintained at 5 pa by introducing C$_3$F$_6$O gas at a rate of 100 ml/min, by applying a high frequency output of 0.8 KW. The etching speed of PSG was 600 Å/min, and the etching speed ratios of PSG/Si and PSG/photo-resist were 9.2 and 8.0, respectively.

EXAMPLE 3

A polysilicon layer having a thickness of 0.4 μm was formed by CVD method on a SiO$_2$ layer having a thickness of 0.9 μm formed on a silicon wafer, and then a pattern mask was formed with a photo-resist layer in the same manner as in Example 1. The sample thereby obtained was introduced into an etching chamber, and while introducing C$_3$F$_6$O gas at a rate of 50 ml/min and Cl$_2$ at a rate of 50 ml/min into the etching chamber, the etching treatment of the polysilicon layer was conducted by electric discharge under a gas pressure of 20 pa. The etching speed of the polysilicon was 2000 Å/min, and the etching speed ratios to the SiO$_2$ substrate and to the photo resist layer were 15 and 9, respectively.

On the other hand, in the case of the etching treatment under the same condition by using CFCl$_3$, the etching speed was 1000 Å/min, and the etching speed ratios to the SiO$_2$ substrate and to the photo-resist layer were 7 and 7, respectively. Further, in the case of the same etching treatment by using a gas mixture of CF$_4$/O$_2$ (10/1), the etching speed was 2000 Å/min, and the etching speed ratios to the SiO$_2$ substrate and to the photo-resist layer were 15 and 3, respectively.

EXAMPLE 4

A pattern mask was formed by two photo-resist layers, i.e. a polysilicon layer having a thickness of 1000 Å formed on a silicon oxide layer and a molybdenum layer having a thickness of 4000 Å formed thereon, and the etching treatment was conducted under the same condition as in Example 3. The etching of the two layers was completed in 3 minutes. The etching speed ratios to the SiO$_2$ substrate and to the photo-resist mask were 13 and 7, respectively. Further, the etching patterns showed anisotropic shapes, and no contamination was observed on the surface of the substrate.

EXAMPLE 5

A PSG layer having a thickness of 1 μm was formed on a Si substrate, and a mask pattern was formed thereon with a photo-resist. The sample thereby obtained was placed on an anode, and the etching treatment of the PSG layer was conducted at a high frequency output of 1.5 KW under a gas pressure of 70 pa by introducing C$_3$F$_6$O gas at a rate of 50 ml/min, with the gap between the cathode and the anode being 8 mm. The etching speed of the PSG layer was 2200 Å/min, and the etching speed ratios to the silicon and to the photo-resist were 20 and 11, respectively. No formation of any polymer was observed under this condition, and no roughening or contamination on the Si substrate surface was observed.

EXAMPLE 6

An aluminum alloy layer formed on a SiO$_2$ substrate was etched by a chlorine-containing gas such as CCl$_4$ or a gas mixture of BCl$_3$ by means of RIE (reactive ion etching). Then, the gas was replaced by C$_3$F$_6$O, and plasma cleaning treatment was conducted for one minute at 0.6 KW under 30 pa by introducing C$_3$F$_6$O at a rate of 100 ml/min. The sample thereby obtained was left to stand in air for a long period of time, whereby no corrosion of aluminum was observed. Further, no formation of any polymer was observed on the substrate surface after the removal of aluminum.

We claim:

1. A dry-etching process comprising a dry-etching treatment of a semiconductor material by action of a gas, characterized in that the dry-etching treatment is conducted under action of a gas composed essentially of a fluorinated ether.

2. The dry-etching process according to claim 1, wherein the fluorinated ether is a perfluoroepoxide.

3. A dry-etching process comprising a dry-etching treatment and a cleaning treatment of a semiconductor material, wherein said cleaning treatment is conducted under action of a gas composed essentially of a fluorinated ether.

4. The dry-etching process according to claim 3, wherein the dry-etching treatment is conducted under action of a gas composed essentially of a halogenated hydrocarbon, and the cleaning treatment is conducted under action of a gas composed essentially of a fluorinated ether.

5. The dry-etching process according to claim 3, wherein the dry-etching and cleaning treatments are conducted simultaneously under action of a gas composed essentially of a fluorinated ether.

6. The dry-etching process according to claims 1 or 3, wherein the gas composed essentially of a fluorinated ether, contains Cl$_2$ or a halogenated hydrocarbon.

7. The process according to claims 1 or 3, wherein additional etching gases are used with said fluorinated ether.

8. The process according to claims 1 or 3, wherein said fluorinated ether is selected from the group consisting of

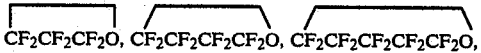

CF$_3$OCF=CF$_2$, CF$_2$IOCF$_2$I, CF$_3$OCF$_3$, CF$_3$OHF$_2$,

CF$_3$OCF$_2$CF$_2$Cl, CF$_2$IOCF$_2$CF$_2$I, CF$_3$OCFClCF$_2$Cl,

CF$_2$ClOCCl$_2$CF$_3$, CF$_3$CF$_2$OCHFBr, CHCl$_2$OCF$_2$CFClBr,

CHF$_2$OCF$_2$CF$_2$Br, CH$_3$OCF$_2$CHCl$_2$, CF$_3$OCF$_2$CF$_3$, and mixtures thereof.

9. The process according to claim 8, wherein said fluorinated ether is

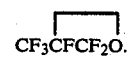

* * * * *